(12) United States Patent
Damadian (10) Patent No.: US 9,575,152 B1
(45) Date of Patent: Feb. 21, 2017

(54) MAGNETIC RESONANCE IMAGING (71) Applicant: Fonar Corporation, Melville, NY (US)

(72) Inventor: Raymond V. Damadian, Woodbury, NY (US)

(73) Assignee: Fonar Corporation, Melville, NY (US)

( * ) Notice: Subject to any disclaimer, the term of this patent is extended or adjusted under 35 U.S.C. 154(b) by 521 days.

(21) Appl. No.: 14/203,451

(22) Filed: Mar. 10, 2014

Related U.S. Application Data (60) Provisional application No. 61/775,610, filed on Mar. 10, 2013, provisional application No. 61/775,614, filed on Mar. 10, 2013.

(51) Int. Cl.
*G01R 33/565* (2006.01)

(52) U.S. Cl.
CPC .................. *G01R 33/5659* (2013.01)

(58) Field of Classification Search
CPC ........................ G01R 33/5659; G01R 33/445
See application file for complete search history.

(56) References Cited

U.S. PATENT DOCUMENTS

| | | | |
|---|---|---|---|
| 4,689,556 A * | 8/1987 | Cedrone | G01R 1/0433 324/756.02 |
| 4,737,713 A | 4/1988 | Danby et al. | |
| RE32,689 E | 6/1988 | Damadian | |
| 5,266,913 A * | 11/1993 | Chapman | G01R 33/4215 324/307 |
| 6,414,490 B1 | 7/2002 | Damadian et al. | |
| 6,677,753 B1 | 1/2004 | Danby et al. | |
| 7,439,738 B2 * | 10/2008 | Pines | G01R 33/36 324/307 |
| 8,036,730 B1 | 10/2011 | Damadian et al. | |
| 8,055,326 B1 | 11/2011 | Dworkin et al. | |
| 2006/0255801 A1 | 11/2006 | Ikeda | |
| 2007/0035301 A1 | 2/2007 | Nakabayashi et al. | |
| 2007/0096739 A1 | 5/2007 | Nakabayashi | |
| 2008/0027666 A1 | 1/2008 | Schenkel et al. | |
| 2009/0015256 A1 | 1/2009 | Bottomley et al. | |
| 2009/0093704 A1 | 4/2009 | Ma | |
| 2011/0044546 A1 | 2/2011 | Pan et al. | |
| 2011/0087090 A1 | 4/2011 | Boernert et al. | |

OTHER PUBLICATIONS

Stark and Bradley, "Magnetic Resonance Imaging", vol. I, pp. 15-32, 1999.

* cited by examiner

*Primary Examiner* — Gregory H Curran
(74) *Attorney, Agent, or Firm* — Lerner, David, Littenberg, Krumholz & Mentlik, LLP (57) ABSTRACT

An MRI apparatus employs a magnet for establishing a $B_0$ field, one or more imaging radiofrequency coils for creating a $B_1$ field, and one or more nulling radiofrequency coils. The RF energy emitted by the nulling radiofrequency coils may be configured such that it disrupts the nuclear magnetic resonance signals emitted by nuclei excited by the $B_1$ field. In addition, the nulling radiofrequency coils may be calibrated to be 180° out of phase such that the RF energy emitted by a pair of nulling radiofrequency coils is cancelled at a location between them.

20 Claims, 7 Drawing Sheets

MAGNETIC RESONANCE IMAGING

CROSS-REFERENCE TO RELATED APPLICATIONS

The present application claims the benefit of the filing date of U.S. Provisional Patent Application No. 61/775,610 filed Mar. 10, 2013, the disclosure of which is hereby incorporated herein by reference. The present application also claims the benefit of the filing date of U.S. Provisional Patent Application 61/775,614, filed Mar. 10, 2013, the disclosure of which is hereby incorporated herein by reference.

TECHNICAL FIELD

The present disclosure is generally directed to a magnetic resonance imaging ("MRI") apparatus and method that includes radiofrequency ("RF") scanning along a line between two RF coils. In particular, this disclosure provides for an MRI apparatus and method that incorporates one or more additional RF coils to create a null zone within an object being imaged to produce a more accurate and clear image.

BACKGROUND

In magnetic resonance imaging, an object to be imaged as, for example, a body of a human subject, is exposed to a strong, substantially constant static magnetic field. Radiofrequency excitation energy is applied to the body, and this energy causes the spin vectors of certain atomic nuclei within the body to rotate or "precess" around axes parallel to the direction of the static magnetic field. The precessing atomic nuclei emit weak radiofrequency signals, referred to herein as magnetic resonance signals. Different tissues produce different signal characteristics. Tissue relaxation times are the dominant factor in determining signal strength. In addition, tissues having a high density of certain nuclei will produce stronger signals than tissues with a low density of such nuclei. Relatively small gradients in the magnetic field are superimposed on the static magnetic field at various times during the process so that magnetic resonance signals from different portions of the patient's body differ in phase and/or frequency. If the process is repeated numerous times using different combinations of gradients, the signals from the various repetitions together provide enough information to form a map of signal characteristics versus location within the body. Such a map can be reconstructed by conventional techniques well known in the magnetic resonance imaging art, and can be displayed as a pictorial image of the tissues as known in the art.

The magnetic resonance imaging technique offers numerous advantages over other imaging techniques. MRI does not expose either the patient or medical personnel to X rays and offers important safety advantages. Also, magnetic resonance imaging can obtain images of soft tissues and other features within the body which are not readily visualized using other imaging techniques. Accordingly, magnetic resonance imaging has been widely adopted in the medical and allied arts.

Many MRI systems use one or more solenoidal superconducting coils to provide the static magnetic field arranged so that the patient is disposed within a small tube running through the center of the coils. The coil and tube typically extend along a horizontal axis, so that the long axis or head-to-toe axis of the patient's body is in a horizontal position during the procedure.

Other MRI systems use iron core magnets to provide a more open environment for the patient. These magnets typically have a ferromagnetic frame with a pair of ferromagnetic poles disposed one over the other along a vertical pole axis with a gap between them for receiving the patient. The frame includes ferromagnetic flux return members such as plates or columns which are located outside the patient receiving area and extend vertically. A magnetic field is provided by permanent magnets or electromagnetic coils (superconductive or resistive) associated with the frame. A magnet of this type can be designed to provide a more open environment for the patient.

Ferromagnetic frame magnets having horizontal pole axes have also been developed. As disclosed, for example, in commonly assigned U.S. Pat. No. 6,414,490, issued on Jul. 2, 2002, and U.S. Pat. No. 6,677,753, issued on Jan. 13, 2004, the disclosures of which are incorporated by reference herein in their entirety, a magnet having poles spaced apart from one another along a horizontal axis provides a horizontally oriented magnetic field within a patient receiving gap between the poles. Such a magnet can be used with a patient positioning device including elevation and rotation mechanisms to provide extraordinary versatility in patient positioning. For example, where the patient positioning device includes a bed or similar device for supporting the patient recumbent position, the bed can be tilted and/or elevated so as to image the patient in essentially any position between a fully standing position and a fully recumbent position, and can be elevated so that essentially any portion of the patient's anatomy is disposed within the gap in an optimum position for imaging.

In each of the above described systems, the quality of an image generated from the (magnetic resonance) MR signals emitted by the processing nuclei will depend on the signal-to-noise ratio (SNR) between the MR signal and other noise omitted from or around the MR imaging system. As such, it is important to increase the SNR of the emitted MR signals in order to achieve high quality MR imaging.

However, the resulting MRI image may not be clear or free from artifacts. For example, difficulties with the RF coils or the emitted magnetic field may produce artifacts in the resulting image (e.g., RF overflow artifacts, eddy current artifacts, zipper artifacts, etc.). These artifacts may make the resulting image unclear or may lead a physician to an incorrect or uncertain diagnosis.

BRIEF SUMMARY

Preventing these and other problems of the prior art are the subject of this disclosure. In one embodiment, this disclosure provides a method that includes subjecting the object to a magnetic field and applying an excitation radiofrequency ("RF") signal to the object so as to tilt spin axes of nuclei within the object relative to the magnetic field. The method may further include applying a spatially inhomogeneous RF variation signal to the object so that the variation signal affects spins within the object except in a zone within the object and receiving RF signals emitted by the object after application of said excitation and variation signals so that the received RF signals include signals emitted by nuclei within said zone.

In another embodiment of the method, said variation signal is effective to substantially randomize the orientations of nuclear spin axes except within said zone.

In a further embodiment of the method, said variation signal includes a random or pseudorandom noise component.

In yet another embodiment of the method, said variation signal is effective to shift the phase of rotation of nuclear spin axes except within said zone so that nuclei outside of said zone emit signals differing in phase from signals emitted by nuclei within zone, and said receiving step includes selecting signals by phase so as to exclude signals emitted by nuclei outside of said zone.

In yet a further embodiment of the method, said variation signal is effective to shift the frequency of rotation of nuclear spin axes except within said zone so that nuclei outside of said zone emit signals differing in frequency from signals emitted by nuclei within said zone, and receiving step includes selecting signals by frequency so as to exclude signals emitted by nuclei outside of said zone.

In another embodiment of the method, said variation signal is inhomogeneous in at least two orthogonal directions.

In a further embodiment of the method, said variation signal is inhomogeneous only in first and second orthogonal directions so that said zone is an elongated line extending in a third direction orthogonal to said first and second directions.

In yet another embodiment of the method, said step of applying a magnetic field is conducted so as to apply a magnetic field gradient in a third direction orthogonal to said first and second directions.

In yet a further embodiment of the method, the method includes varying the spatial inhomogeneity of said variation signal so as to shift said zone in at least one of said first and second directions.

In another embodiment of the method, said step of applying an excitation signal is performed so that said excitation signal consists essentially of frequencies corresponding to the Larmor frequencies of nuclei in a slice extending in said first and second directions and having a thickness in said third direction, whereby the received signals are signals from nuclei in a voxel at the intersection of said elongated zone and said slice.

This disclosure also provides an apparatus that addresses the foregoing problems. In one embodiment, the apparatus may include a magnet assembly configured to subject an object to a magnetic field, a first pair of radiofrequency coils configured to apply an excitation radiofrequency ("RF") signal to the object so as to tilt spin axes of nuclei within the object relative to the magnetic field, and a second pair of radiofrequency coils configured to apply a spatially inhomogeneous RF variation signal to the object so that the variation signal affects spins within the object except in a zone within the object. The apparatus may also include a radiofrequency detector configured to detect RF signals emitted by the object after application of said excitation and variation signals so that the received RF signals include signals emitted by nuclei within said zone.

In another embodiment of the apparatus, said variation signal is effective to substantially randomize the orientations of nuclear spin axes except within said zone.

In a further embodiment of the apparatus, said variation signal includes a random or pseudorandom noise component.

In yet another embodiment of the apparatus, said variation signal is effective to shift the phase of rotation of nuclear spin axes except within said zone so that nuclei outside of said zone emit signals differing in phase from signals emitted by nuclei within zone, and said radiofrequency detector is further configured to select signals by phase so as to exclude signals emitted by nuclei outside of said zone.

In yet a further embodiment of the apparatus, said variation signal is effective to shift the frequency of rotation of nuclear spin axes except within said zone so that nuclei outside of said zone emit signals differing in frequency from signals emitted by nuclei within said zone, and said radiofrequency detector is further configured to detect signals by frequency so as to exclude signals emitted by nuclei outside of said zone.

In another embodiment of the apparatus, said variation signal is inhomogeneous in at least two orthogonal directions.

In a further embodiment of the apparatus, said variation signal is inhomogeneous only in first and second orthogonal directions so that said zone is an elongated line extending in a third direction orthogonal to said first and second directions.

In yet another embodiment of the apparatus, said magnet assembly is further configured to apply a magnetic field gradient in a third direction orthogonal to said first and second directions.

In yet a further embodiment of the apparatus, varying the spatial inhomogeneity of said variation signal is performed so as to shift said zone in at least one of said first and second directions.

In another embodiment of the apparatus, the first radiofrequency coil is further configured to apply said excitation signal consisting essentially of frequencies corresponding to the Larmor frequencies of nuclei in a slice extending in said first and second directions and having a thickness in said third direction, whereby the detected signals are signals from nuclei in a voxel at the intersection of said elongated zone and said slice.

BRIEF DESCRIPTION

DETAILED DESCRIPTION

Figure 1:
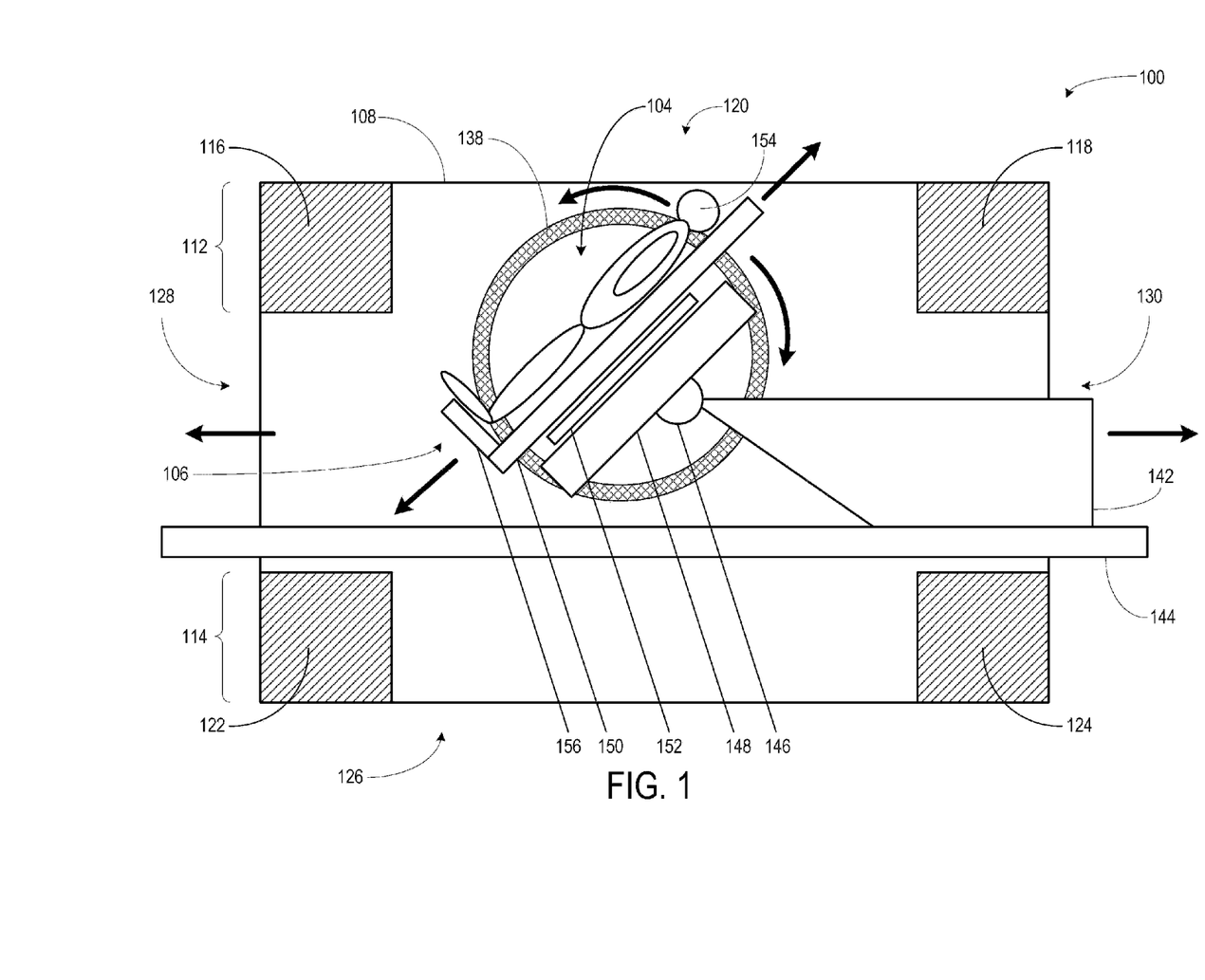
FIG. 1 illustrates a sectional view of an exemplary MRI apparatus with the magnetic flux assemblies emphasized according to aspects of the disclosure.
Figure 2:
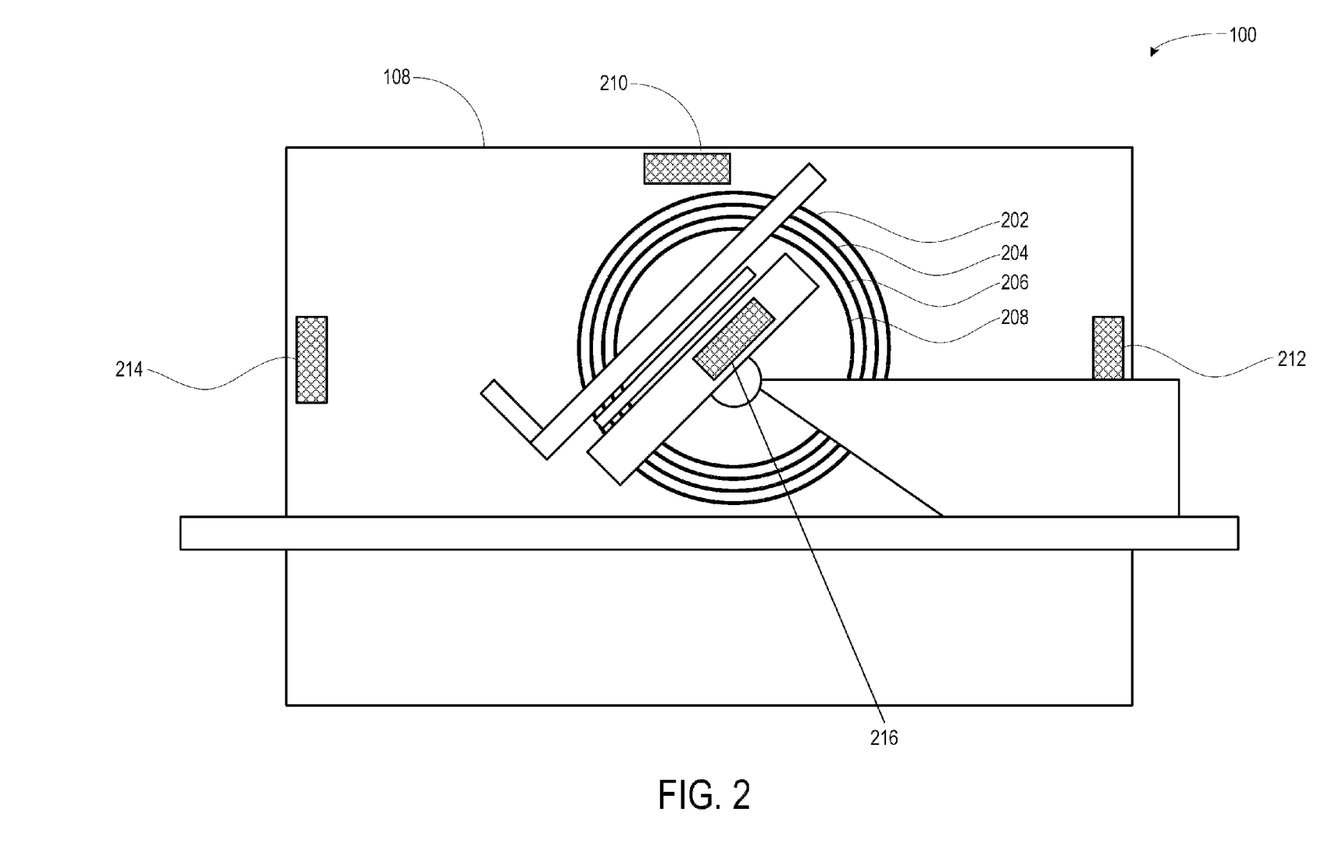
FIG. 2 illustrates a sectional view of the exemplary MRI apparatus of FIG. 1 with the radiofrequency coils emphasized according to aspects of the disclosure.

FIG. 1 shows a sectional view of an MRI apparatus 100. Emphasis in FIG. 1 is on the various assemblies relating to the generation of the magnetic field. FIG. 2, as discussed below, is directed to the radiofrequency coils used in the MRI apparatus 100 to image an object. The various assembles shown in FIG. 1 and FIG. 2 constitute the MRI apparatus 100.

In one embodiment, the MRI apparatus 100 includes a magnet having a ferromagnetic frame, a magnetic flux generator 104, and a patient handling system 106. The ferromagnetic frame includes a first side wall 108 and a second side wall (not shown). The side walls extend vertically. For purposes of clarity, FIG. 1 does not show the second side wall or any of its associated structures. The ferromagnetic frame also includes a top flux return structure 112 and a bottom flux return structure 114. The top flux return structure 112 may include two columnar structures 116 and 118. Between these two columnar structures, a top opening 120 is defined. Similarly, the bottom flux return structure 114 may include two columns 122 and 124 that together define a bottom opening 126. Thus, the side walls and and the flux return members 112 and 114 form a rectilinear structure, with the top flux return structure 112 constituting the top wall of the rectilinear structure, the bottom flux return structure 114 constituting the bottom wall of the rectilinear structure and the side walls forming the side walls of the rectilinear structure. The frame defines a front patient opening 128 on one side of the frame and a similar back patient opening 130 on the opposite side of the frame.

The ferromagnetic frame further includes a first magnetic pole and a second magnetic pole. The first magnetic pole extends from the first side wall 108 towards the second side wall and the second magnetic pole extends from the second side wall towards the first side wall 108. The magnetic poles are generally cylindrical and are coaxial with one another on a common horizontal polar axis. Between the magnetic poles is a gap accessed by the front patient opening 128, the back patient opening 130, the top opening 120 or the bottom opening 126.

The magnetic flux generator 104 includes a first electromagnetic coil assembly 138 magnetically coupled to ferromagnetic frame, proximate to side 108, and parallel to side 108. The magnetic flux generator 104 also includes a second electromagnet coil assembly (not shown) magnetically coupled to ferromagnetic frame 102, proximate to the second side wall, and parallel to the second side wall. As previously noted, these electromagnetic coil assemblies 138 and 140 may be either resistive or superconductive. Alternatively, the magnetic flux generator 104 may be a permanent magnet. The magnetic flux generator 104 may be configured to emit a magnetic field $B_0$ along one or more axes. The magnetic flux generator 104 may also include one or more gradient coils (not shown) for inducing a gradient in the $B_0$ magnetic field.

The patient handling system 106 is capable of three degrees of motion. The patient handling system 106 may be used to support a patient in a standing or sitting position, that is, in a vertical position, in addition to a recumbent or horizontal position. The patient handling system further supports positioning of a patient in the Trendelburg and reverse-Trendelburg orientations and at angle positions between horizontal and vertical. Generally, the degrees of motion allow for positioning of the patient in a variety of orientations or positions. The patient handling system 106 includes a carriage 142 mounted on rails 144. The carriage 142 may move linearly back and forth along the rails 144. The rails 144 typically do not block the bottom open space 126.

A generally horizontal pivot axis 146 is mounted on carriage 142. An elevator frame 148 is mounted to the pivot axis 146. The carriage 142 is operable to rotate the elevator frame 148 about the pivot axis 146. A patient support 150 is mounted on the elevator frame 148. The patient support 150 may be moved linearly along the elevator frame 148 by an actuator 152. Thus, a patient 154 can be positioned with a total of three degrees of freedom, or along three axes of movement. Specifically, the patient handling system 106 can move a patient 154 in two linear directions and also rotate patient 154 around an axis. The solid black arrows of FIG. 1 show the three axes of movement possible with the patient handling system 106. Note that often the rails 144 are mounted such that portions of patient 154 may be positioned below the rails through bottom open space 126.

Often, a foot rest 156 may be used in order to keep a patient in a standing position. Given the wide variety of positions possible with the patient handling system 106, many other such supports may be required, such as seats or straps.

Referring to FIG. 2 is a sectional view of the exemplary MRI apparatus 100 of FIG. 1 with the radiofrequency coils of the MRI apparatus 100 emphasized. In one embodiment, the MRI apparatus 100 may include various radiofrequency coils 202-216 that may be used in the MRI apparatus 100 according to aspects of the disclosure. For clarity and simplicity, the various magnetic flux assemblies shown in FIG. 1 have been omitted.

In one embodiment, the MRI apparatus 100 may include one or more imaging radiofrequency coils 202-208 for exciting the nuclei of the object being imaged on the table (i.e., for creating the $B_1$ field). The imaging radiofrequency coils 202-208 may be any combination of transmit and receive radiofrequency coils, transmit-only radiofrequency coils, and receive-only radiofrequency coils. Furthermore, the MRI apparatus may include one or more radiofrequency coils 202-208 for imaging the object along one or more axes, such as the x-axis, the y-axis, and the z-axis. In one embodiment, there may be a pair of radiofrequency coils (i.e., a transmit radiofrequency coil and a receive radiofrequency coil) for each axis. FIG. 2 is an illustration of the MRI apparatus 100 with imaging radiofrequency coils 202-208 for imaging along the x-axis and/or y-axis, but it should be understood that there may be also be a pair of radiofrequency coils along the z-axis as well. In one embodiment, the emitted $B_1$ field is perpendicular to the $B_0$ field. The emitted $B_1$ may be directed along any axis (e.g., the x-axis, the y-axis, or the z-axis) depending on the axis in which the $B_0$ field is generated. For example, where the $B_0$ field is generated in the z-axis, the $B_1$ field may be generated in the x-axis or y-axis.

While the imaging radiofrequency coils 202-208 are illustrated as being placed perpendicular to the patient handling system 106, one of ordinary skill in the art would understand that other geometries of the imaging radiofrequency coils 202-208 are also possible. In one embodiment, an RF coil, such as a transmit RF coil, may be positioned proximate the anatomy of interest. For example, if an MRI is being performed of a patient's head, the patient's head may be positioned in the coil structure. In a further example, if a portion of the spine is being imaged, the RF coil may be placed adjacent the patient's back. Depending on the anatomy of interest RF coils of the type described in U.S. Pat. No. 8,055,326, which is assigned to the assignee of the present disclosure, discloses various coil geometries that may be employed. For clarity, U.S. Pat. No. 8,055,326 is incorporated by reference herein in its entirety.

Like a transmit RF coil, a receive RF coil may be positioned proximate the anatomy of interest. As emitted RF signals from the nuclei of the object being imaged will likely be of low signal strength, an RF receive coil may be positioned very near the anatomy of interest. In addition, it is not uncommon that the RF transmitter and receiver coils will comprise the same unit that may switch between transmitting and receiving the RF signals. Receiver coil geometries such as those described in the '326 patent may be used.

Additional electronic components, such as one or more capacitors that form a resonant circuit may be used in conjunction with the imaging radiofrequency coils 202-208. In this regard, one or more of the imaging radiofrequency coils 202-208 may be included in a transmitter circuit (not shown) for transmitting RF energy and one or more of the of the imaging radiofrequency coils 202-208 may be included in a receiver circuit (not shown) for detecting RF energy emitted by excited nuclei.

The transmitter and/or receiver circuit may be dynamically adjusted to adjust the phrase and/or frequency of the transmitted RF energy. For example, the coupling between one or more of the imaging radiofrequency coils 202-208 and the one or more capacitors may be adjusted. By adjusting the coupling between one or more of the imaging radiofrequency coils 202-208 and the capacitors, the phase and/or frequency of the one or more imaging radiofrequency coils 202-208 may be dynamically tuned.

As with the transmitter circuit, a receiver circuit may also include additional electronic components to form a resonant circuit, and the coupling between the RF receiver coil and the one or more capacitors may also be adjusted. By adjusting the coupling between the RF receiver coil and the capacitors, the phase and/or frequency of the receiver circuit may be dynamically tuned.

Dynamic tuning of the transmitter circuit and/or the receiver circuit may enable the transmitter/receiver pair to collect signals across a wide band of frequencies, even if each circuit itself is tuned to a relatively narrow bandwidth (e.g., 100 Hz, 10 Hz, 1 Hz). This may be accomplished by stepwise adjusting the frequency of the transmitter circuit so that the full band of desired signal frequencies is swept across. For instance, the transmitter circuit may have a bandwidth of about 100 Hz and may be tuned to a center frequency of 25.5 MHz. Yet the transmitter circuit may still be capable of transmitting RF energy at frequencies outside the 100 Hz bandwidth of the 25.5 MHz band by dynamically tuning the transmitter circuit to other center frequencies in 100 Hz steps (e.g., 25.0001 MHz, 25.0002 MHz, etc.) so as to excite several imaging planes of the patient (e.g., each plane at a different frequency of the slice-select gradient). In a similar fashion, the receiver circuit may have a bandwidth of about 100 Hz and may be tuned to a center frequency of 25.5 MHz. Yet the receiver circuit may still be capable of receiving MR signals at frequencies outside the 100 Hz bandwidth of the excited center frequencies by dynamically tuning the receiver circuit to other center frequencies in 100 Hz steps. For example, 25.001 MHz and 25.002 MHz so as to sample the entire frequency encoded gradient of the slice excited by the transmitter.

Figure 3A:
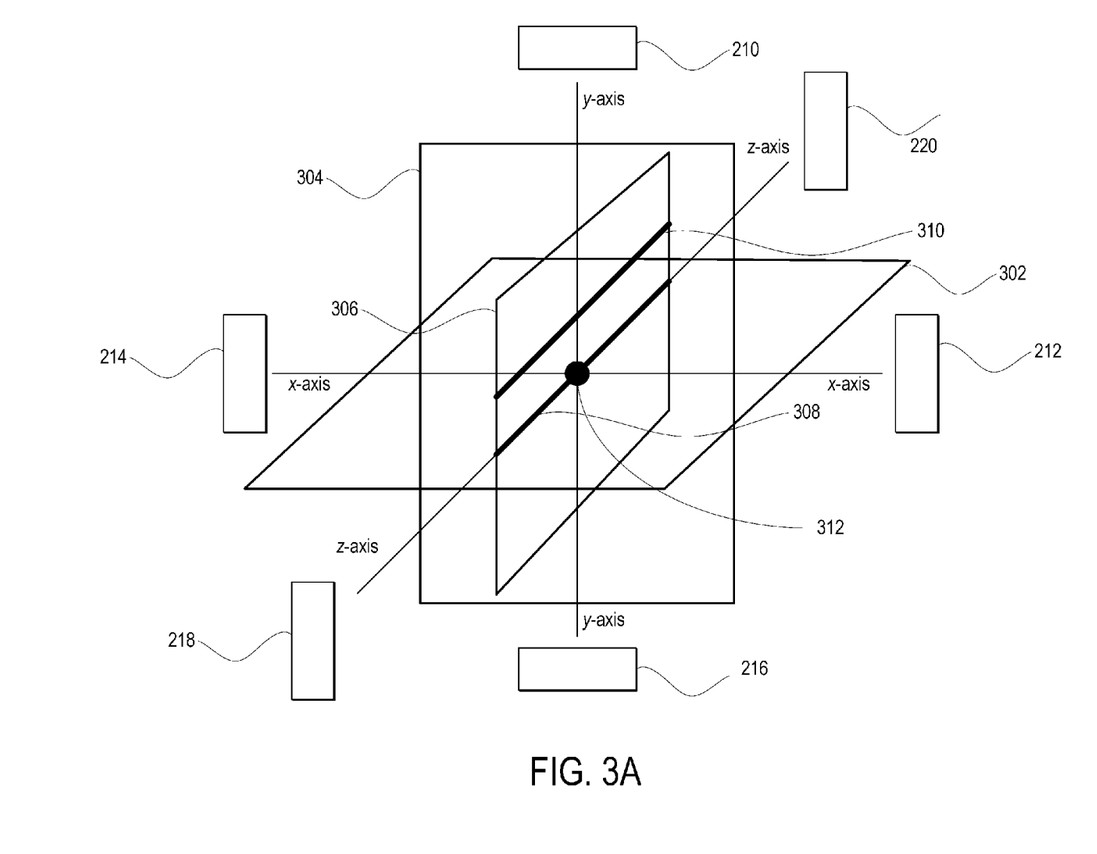
FIG. 3A illustrates an exemplary arrangement of nulling radiofrequency coils according to aspects of the disclosure.

In addition to the imaging radiofrequency coils 202-208, the MRI apparatus 100 may also include radiofrequency coils 210-216 that produce RF energy which affect the $B_0$ magnetic field or the resonance signals emitted by the nuclei excited by the $B_1$ field. The nulling radiofrequency coils 210-216 may include one or more pairs of radiofrequency coils for one or more axes of the object being imaged. For example, there may be a pair of nulling radiofrequency coils for each of three axes of an object being imaged. In other words, there may be a pair of nulling radiofrequency coils assigned to the x-axis, a pair of nulling radiofrequency coils assigned to the y-axis, and a pair of nulling radiofrequency coils assigned to the z-axis. In addition, as one of ordinary skill in the art would understand, the arrangement of the nulling radiofrequency coils 210-216 may encompass various different arrangements depending on the object being imaged. As shown in FIG. 2, the nulling radiofrequency coils 210-216 may include coils arranged on the x-axis and y-axis and, as FIG. 3A illustrates, there may be nulling radiofrequency coils 218-220 arranged on the z-axis as well.

The nulling radiofrequency coils 210-220 may be used to produce a null zone (e.g., a plane, a line, or a point) within the object being imaged within the MRI apparatus 100. In particular, a pair of nulling radiofrequency coils may be configured to emit a frequency or a bandwidth of frequencies based on the Larmor frequency of a selected group of nuclei being imaged, but the pair of nulling radiofrequency coils may be out of phase with respect to one another, depending on the location of the group of nuclei being imaged. As discussed below, this phase difference has the effect of canceling out the RF energy emitted by the nulling radiofrequency coils 210-220 at a selected location within the object being imaged.

For example, where a selected pair of nulling radiofrequency coils are driven at the same frequency but 180° out of phase, the RF energy emitted by each of the nulling radiofrequency coils will cancel each other out at a midpoint between them. Where a single pair of nulling radiofrequency coils are energized, the RF energy fields from the two nulling radiofrequency coils produce a null plane (i.e., a plane where the RF energy from the nullling radiofrequency coils have been canceled out). Where a second pair of nulling radiofrequency coils are energized orthongal to the first pair of nulling radiofrequency coils, a null line is formed based on the phase differences in the RF energy emitted by the first and second pair of nulling radiofrequency coils. Finally, where a third pair of radiofrequency coils are energized orthogonal to the first and second pair of nulling radiofrequency coils, a null point may be formed based on the phase differences in the three pair of nulling radiofrequency coils. For reference by the reader, the term "null zone" may refer to the null plane, the null line, or the null point produced by one or more pairs of nulling radiofrequency coils.

Furthermore, the RF energy emitted by the nulling radiofrequency coils 210-220 may have characteristics that affect the resonance signals emitted by the nuclei within the object being imaged and subject to the $B_0$ magnetic field but outside of the created null zone. In other words, the nulling radiofrequency coils 210-216 may be configured to emit spatially inhomogenous RF energy to disrupt the emitted nuclear magnetic resonance ("NMR") signals such that only the nuclei within the null zone emit NMR signals or respond to the $B_0$ magnetic field.

As one example, the frequency of the RF energy emitted by the nulling radiofrequency coils 210-220 may be similar to, or based on, the Larmor frequency of the nuclei being imaged from the object. However, the frequency of the RF energy from the nulling radiofrequency coils 210-220 may be out of phase or include a multiplicity of phases with respect to the nuclei's Larmor frequency. Thus, the nulling radiofrequency coils 210-220 may substantially randomize the orientations of nuclear spin axes except within the null zone. During imaging, and as discussed below, the resonance signals emitted by the nuclei may be selected by frequency so as to exclude signals emitted by nuclei outside of the null zone.

In yet still another implementation, a noise signal from a noise generator may be output by the nulling radiofrequency coils 210-220 so as to create a purposeful interference in the resonance signals emitted by the nuclei outside of the null zone.

Accordingly, nuclei that are not within the null zone will not respond to the RF energy emitted by the imaging radiofrequency coils 202-208. Thus, when the nulling radiofrequency coils 210-220 are engaged, an operator of the MRI apparatus 100 can be assured that the image resulting from the energy emitted by the nuclei of the object being imaged are those nuclei contained within the null zone.

FIG. 3A illustrates an example of an arrangement of the above-described nulling radiofrequency coils 210-220 to create the null zone. In particular, FIG. 3A illustrates that the nulling radiofrequency coils 210-220 may be configured to produce a first null plane 302 in the y-axis, a second null plane 304 in the z-axis, and a third null plane 306 in the x-axis. Although FIG. 3A illustrates that the nulling radiofrequency coils 210-220 may be arranged along three orthogonal axes, one of ordinary skill in the art will appreciate that other geometries are also possible.

The null zone created by the intersections of one or more of the null planes 302-306 may be moved throughout the object being imaged within the MRI apparatus 100. For example, the null zone may be moved by a calibrated unbalancing of the nulling radiofrequency coils 210-220 (e.g., by changing the amplitude of the emitted signal) while keeping the phase difference between the nulling radiofrequency coils 210-220 at 180°.

By unbalancing one or more of the nulling radiofrequency coils 210-220 across time, the nulling radiofrequency coils 210-220 may be used to scan the nuclei of an object being imaged by the MRI apparatus 100. FIG. 3A further illustrates an exemplary first scan line 308. The first scan line 308 may be produced from the intersection of the first null plane 302 (i.e., the null plane formed in the y-axis) and the third null plane 306 (i.e., the null plane formed in the x-axis).

Where the nulling radiofrequency coils 218-220 parallel to the z-axis are balanced (i.e., radiofrequency coils 218-220), the null plane 304 for the z-axis would be located at z=0, i.e., centered at z=0, x=0, and y=0. Where the third null plane 306 intersects with the first null plane 302 and the second null plane 304, a null point 312 would be formed at x=0, y=0, and z=0.

The null point 312 formed by the intersection of the various null planes 302-306 may be moved in one or more directions. For example, through a calibrated unbalancing of the nulling radiofrequency coils 218-220, the second null plane 304 may be moved along the z-axis. Through this movement, the null point 312 can also moved to any location along a first scanning line 308 to complete a first scan line. A second scanning line 310 may be completed through a calibrated unbalancing of the nulling radiofrequency coils 210-216 to establish the first null plane 302, and then incrementally unbalancing the nulling radiofrequency coils 218-220 to incrementally move the null point 312.

Through repetition, one or more scan lines may be completed in one or more of the axes shown in FIG. 3A. In other words, the creation of the null zone may be a cyclical process, whereby the frequencies and/or the phases of the RF energy being emitted by the nulling radiofrequency coils are cyclically changed according to the location where the null zone is desired. In one embodiment, such a cyclical process may be employed where the imaging radiofrequency coils 202-208 are continuously engaged, such as in continuous wave spectroscopy. In this example, the NMR signals emitted by the nuclei excited by the $B_1$ RF field would be continuously emitted, but would be destroyed everywhere outside of the null zone, thus allowing the amplitude of the NMR signals to continuously mapped along the scanning lines of the moving null point.

While FIG. 3A illustrates that the null planes 302-306 may be orthogonal, oblique null planes may also be scanned and mapped. For example, oblique planes may be mapped by creating one or more oblique RF gradients and one or more matching oblique null planes.

Figure 3B:
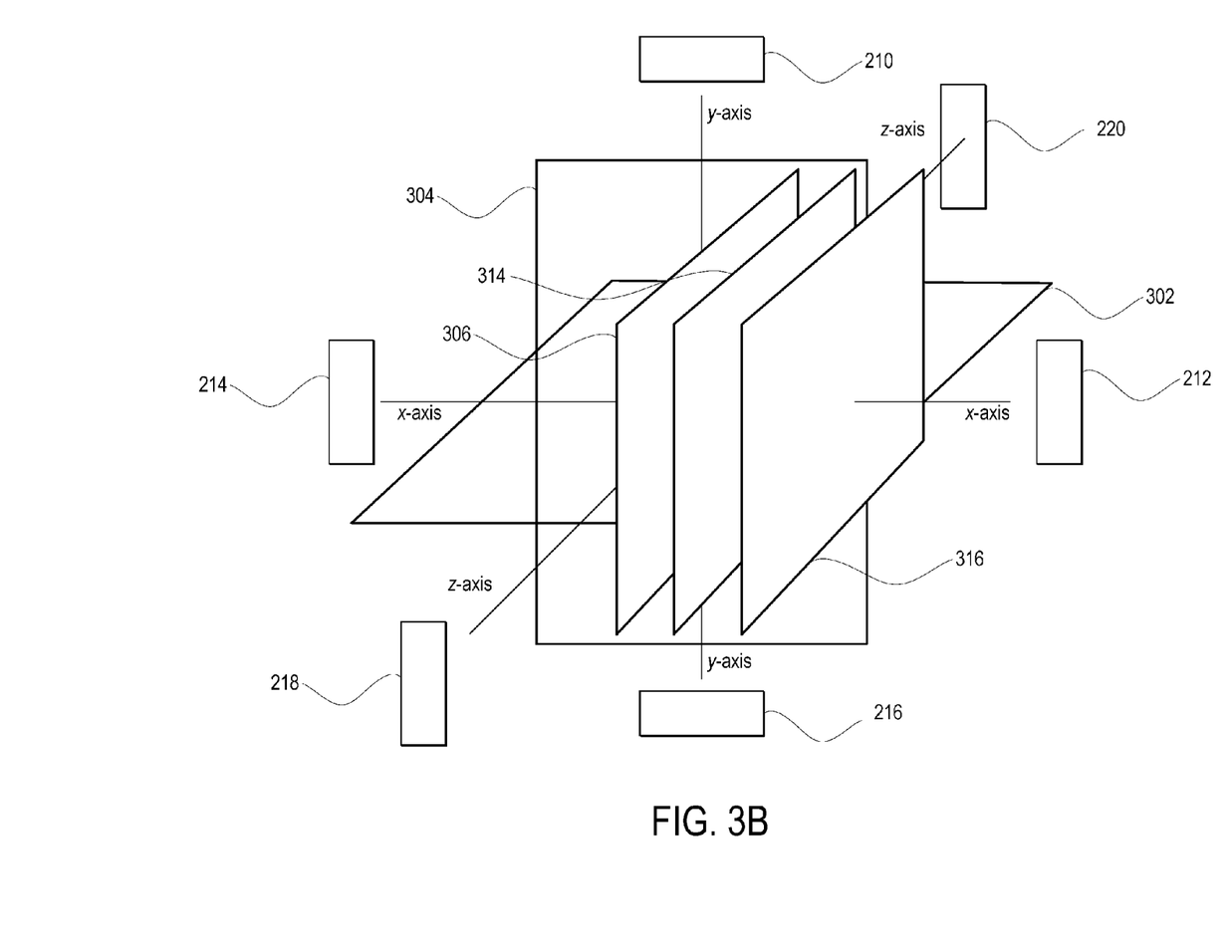
FIG. 3B illustrates an exemplary methodology for obtaining a multi-slice scan horizontally according to aspects of the disclosure.
Figure 3C:
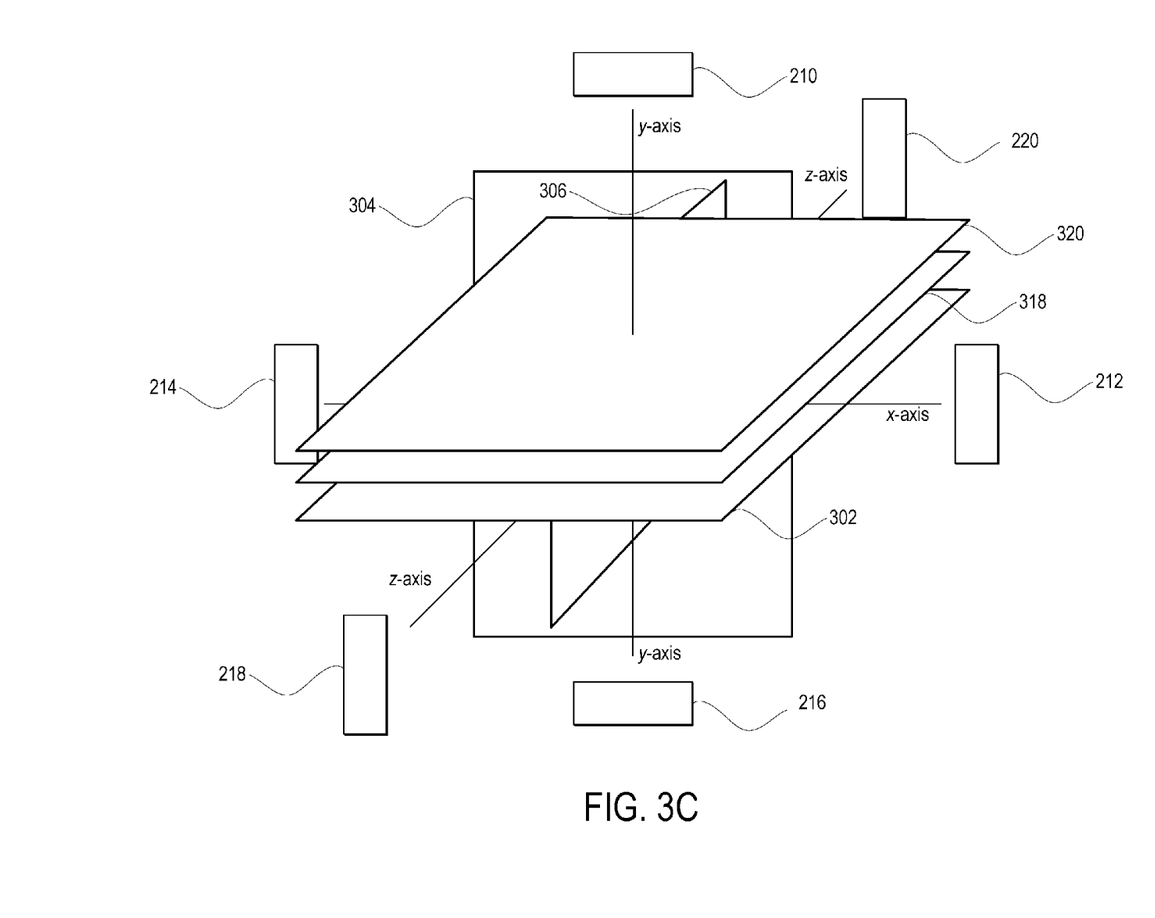
FIG. 3C illustrates an exemplary methodology for obtaining a multi-slice scan vertically according to aspects of the disclosure.

Multi-slice scans of the various axes shown in FIG. 3A may also be accomplished. FIG. 3B illustrates a methodology for obtaining a multi-slice scan horizontally according to aspects of the disclosure. In particular, the null plane 306 may be moved along the x-axis (i.e., through a calibrated unbalancing of the nulling radiofrequency coils 212-214), and the scan line procedure discussed above may be performed for points along the x-axis. Planes 314-316 are intended to illustrate movement of plane 306 along the x-axis. FIG. 3C illustrates another methodology for obtaining a multi-slice scan vertically according to aspects of the disclosure. In particular, the null plane 302 may be moved along the y-axis and the foregoing scan line procedure may be performed for points along the y-axis. Planes 318-320 are intended to illustrate movement of plane 302 along the y-axis.

When a portion of an object is being imaged, nuclei within and outside of the null zones would be excited by the imaging radiofrequency coils 202-208. Accordingly, the excited nuclei would then emit NMR signals in response. However, for nuclei outside of the null zone, any emitted NMR signals would be destroyed, suppressed, or otherwise changed so as to not be detected by the resonant receiving circuit. Thus, the NMR signals emitted by the nuclei within the null zone would be detectable by the MRI apparatus 100.

An image corresponding to the excited nuclei within the null zone may be acquired during the null zone scanning process described above. For example, where the null plane 304 in the z-axis is moved continuously, various characteristics of the excited nuclei within the moving null plane 304 may be measured and displayed. Examples of such characteristics include the echo amplitude of the excited nuclei, such as where a spin-echo pulse sequence is applied, and the free induction decay (FID) amplitude, such as where an FID sequence is applied.

In one embodiment, the measurements of the nuclei's characteristics may be displayed in the analog domain. That is, an analog signal may be measured and delivered to an electron gun of a cathode ray tube (CRT) or other display.

In one imaging procedure where the nulling radiofrequency coils 210-220 are engaged to form a null point (e.g., null point 312), the amplitudes of the signal applied to the nulling radiofrequency coils 210-220 may be varied progressively so as to move the null point throughout the object being imaged, while simultaneously applying continuous wave ("CW") RF signals at the Larmor frequency in a non-selective manner so as to obtain a CW-NMR signal representing the magnetic resonance properties of only that portion of the object being imaged contained within the null zone. The CW signal may be directly displayed as a brightness value on a scanning raster (e.g., a television screen), scanned in synchronism with the movement of the null point. Furthermore, any other form of magnetic resonance data collection may be performed at the null point, such as by pulsing the non-selective Larmor frequency RF signal of the $B_1$ field.

In another imaging procedure, NMR signals may be obtained from one or more null lines rather than from the null point. In this procedure, the NMR signals may be collected in the presence of a read-out gradient and subjected to a one-dimensional Fourier transformation to yield signals from individual points along the line.

While analog imaging of the NMR signals may be employed, the measurements of the nuclei's characteristics may also be stored digitally. In other words, the characteristics of the nuclei within the null zone (e.g., the echo amplitude or the FID amplitude) may be digitally sampled and stored during null zone scanning.

The time to complete a scan (i.e., a complete slice) along a given axis may be completed relatively rapidly depending on the sampling interval. Given null zone scanning along the null plane 304 in the z-axis, the time to complete a scan may be 625 milliseconds for a 10 μsec. sampling interval or 62.5 μsec. using a 1 μsec. sampling interval.

Additional techniques could decrease the time needed for scanning. For example, transmitting the echo amplitude or the FID amplitude voltage directly to the CRT and not taking the time to digitally sample (digitize) could move the scan even faster. This procedure would be extremely fast and the reduce the digitizing of 65,000 pixels (10 μsec. sampling intervals) or 65 millisecondsof digitizing 65,000 pixels at 1 μsec. sampling intervals.

Figure 4:
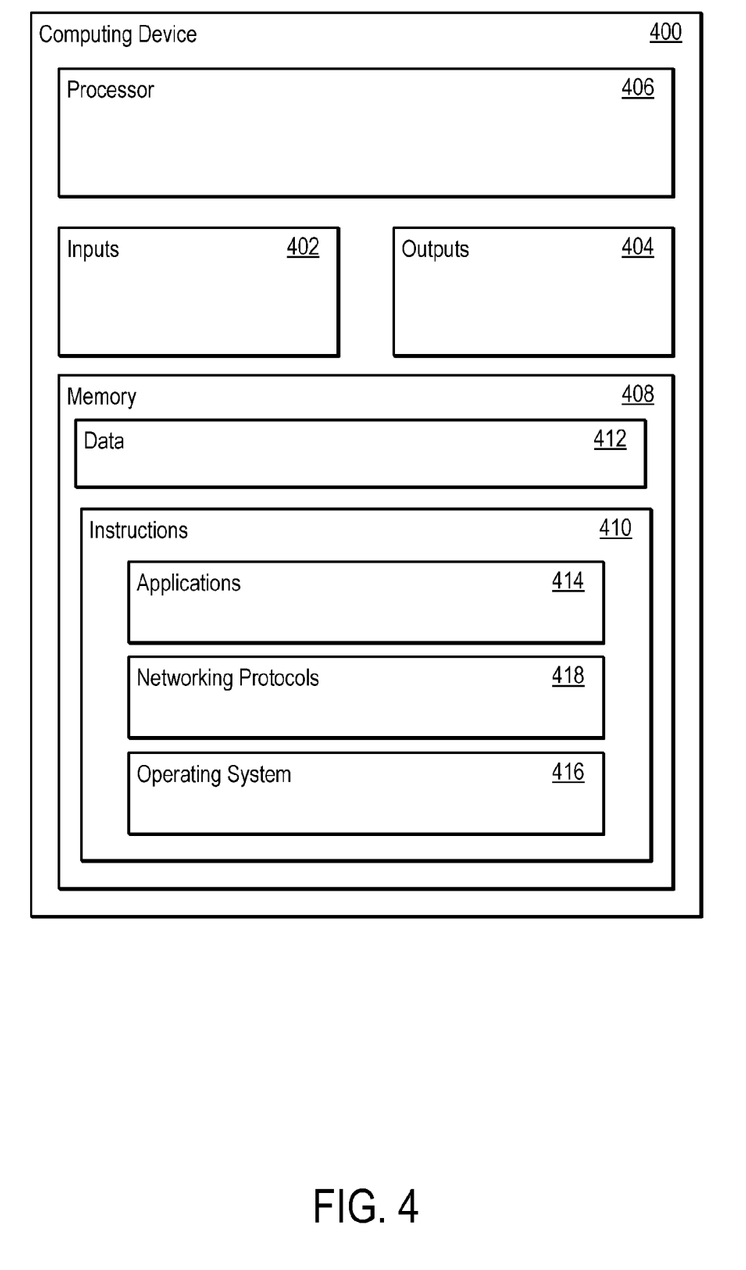
FIG. 4 illustrates an exemplary computing device for generating MRI images according to aspects of the disclosure.

FIG. 4 shows one example of an apparatus 400 for implementing the computer that processes the RF signals and generates the MRI image. The example apparatus 400 is a computing device that may be used to further control the MRI subsystem 100.

The apparatus 400 may include, for example, one or more user inputs 402 such as a keyboard and mouse and/or other types of input devices such as pen-inputs, joysticks, buttons, touch screens, etc., and one or more outputs 404, such as a generated MRI image. As discussed above, the outputs 404 may include an analog output (e.g., a raster screen) for displaying or a digital output. As shown, apparatus 400 further contains a processor 406, and memory or a non-transitory, computer-readable medium 408.

Memory 408 stores information accessible by processor 406, including instructions 410 that may be executed by the processor 408 and data 412 that may be retrieved, manipulated or stored by the processor. The memory 408 may be of any type capable of storing information accessible by the processor, such as a hard-drive, ROM, RAM, CD-ROM, DVD, Blu-Ray disk, flash memories, write-capable or read-only memories. The processor 406 may comprise any number of well known processors, such as processors from Intel Corporation and Advanced Micro Devices. Alternatively, the processor 406 may be a dedicated controller for executing operations, such as an ASIC.

The instructions 410 may comprise any set of instructions to be executed directly (such as machine code) or indirectly (such as scripts) by the processor. In that regard, the terms "instructions," "applications" and "programs" are used interchangeably herein. The instructions may be stored in any computer language or format, such as in executable/object code or modules of source code.

Data 412 may be retrieved, stored or modified by processor 406 in accordance with the instructions 410. The data may be stored as a collection of data. For instance, although the invention is not limited by any particular data structure, the data may be stored in computer registers, in a relational database as a table having a plurality of different fields and records, XML documents, or flat files.

The data 412 may also be formatted in any computer readable format such as, but not limited to, binary values, ASCII etc. Similarly, the data 412 may include images stored in a variety of formats. Moreover, the data 412 may include any information sufficient to identify the relevant information, such as descriptive text, proprietary codes, pointers, references to data stored in other memories (including other locations in a network) or information which is used by a function to calculate the relevant data.

Although the processor 406 and memory 408 are functionally illustrated in FIG. 4 as being within the same block, it will be understood that the processor and memory may actually comprise multiple processors and memories that may or may not be stored within the same physical housing or location. For example, some or all of the instructions and data may be stored on a computer-readable removable recording medium such as a CD-ROM, DVD or Blu-Ray disk. Alternatively, such information may be stored within a read-only computer chip. Some or all of the instructions and data may be stored in a location physically remote from, yet still accessible by, the processor. Similarly, the processor may actually comprise a collection of processors which may or may not operate in parallel. Data may be distributed and stored across multiple memories such as hard drives, data centers, server farms or the like.

In addition, the memory 408 in the computing device 400 may include one or more applications or programs 414 adapted to provide the any of the functions described with respect to the computer 400 and in accordance with the various aspects of the invention discussed above and below. Each device may include and execute specific instructions or applications, desirably under management of the processor 306 in conjunction with an operating system 416 and networking protocols instructions 418 to provide the functionality described above.

Figure 5:
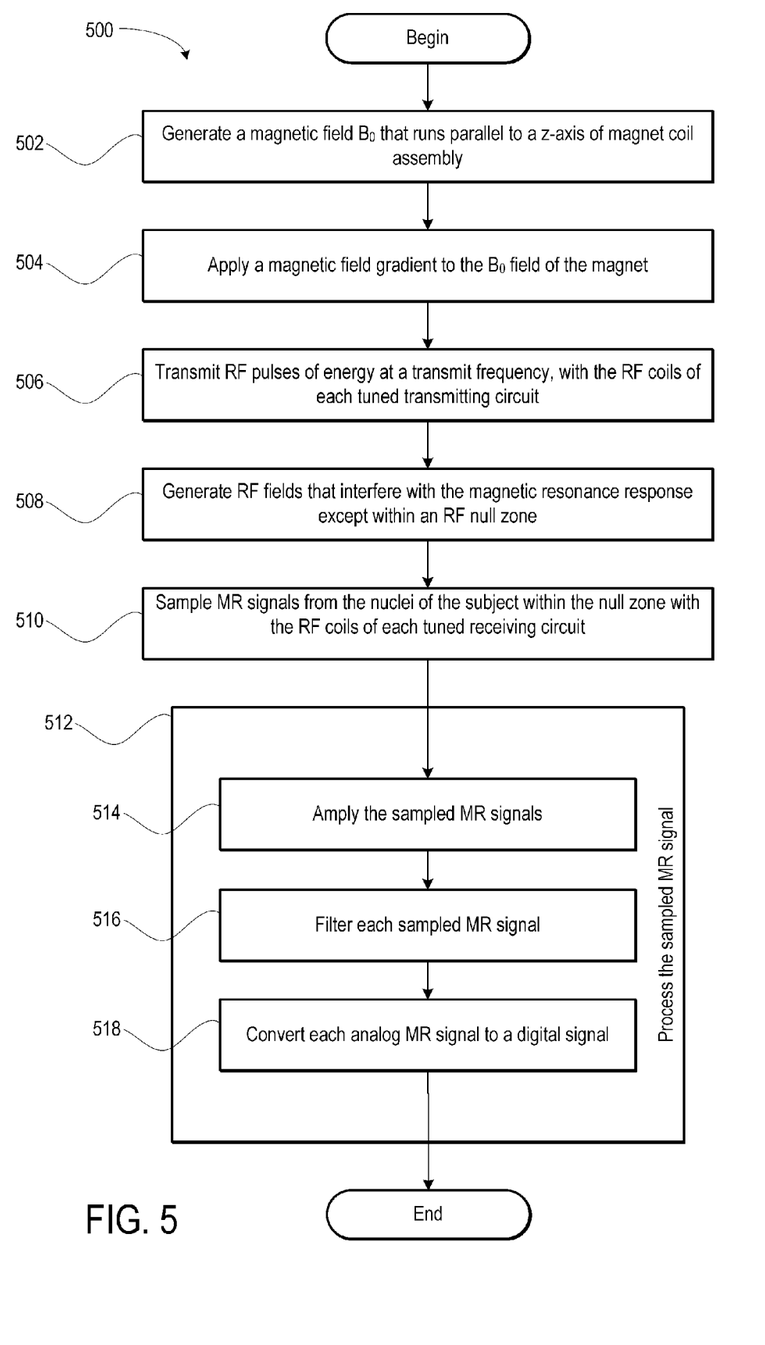
FIG. 5 illustrates exemplary operations that may be performed by the MRI apparatus of FIG. 1 according to aspects of the disclosure.

FIG. 5 is a flow chart that depicts an operation 500 of the MRI apparatus 100. The steps of the operation 500 may be handled in a different order or simultaneously, and that one or more steps may be added or omitted. In addition, other steps of the operation 500 may be performed as disclosed in the non-provisional application entitled "Magnetic Resonance Imaging," Ser. 14/203,389, the disclosure of which is incorporated by reference in its entirety.

In block 502 of the operation 500, the magnetic poles of the magnet coil assembly 104 generate a magnetic field $B_0$ that runs parallel to a z-axis of the magnet coil assembly 104. In block 504, gradient coils are engaged to induce a gradient in the $B_0$ field. With a gradient, the magnetic field strength of the $B_0$ field gradually varies along the length of the gradient axis. The gradient axis may be perpendicular to the axis of the $B_0$ field, and may be selected based on the desired imaging plane of the subject (e.g., a coronal view, an axial view, a sagittal view, or an angled view). The generated gradient causes nuclei of the subject to be excitable at different resonant frequencies depending on their position along the gradient. For example, if a gradient is generated along the x-axis, all of the nuclei within a first slice transverse to the x-axis are excitable at a first resonance frequency (e.g., 25.5 MHz), whereas the nuclei of a second slice axially displaced from the first slice are excitable at a second resonance frequency (e.g., 25.0001 MHz).

In block 506, the RF coil of the tuned transmitting circuit transmits one or more pulses of RF energy at a transmit frequency. The one or more pulses of RF energy may be transmitted in a direction perpendicular to the gradient axis discussed above. The RF pulse temporarily excites the nuclei of the subject at the particular slice of the subject whose magnetic field strength generates a nuclear resonance frequency that corresponds to the transmitter frequency. The particular thickness of the excited slice may depend on the magnitude or steepness of the $B_0$ field gradient and the bandwidth of the tuned transmitter circuit. For instance, a pulse having a narrower bandwidth will excite only the nuclei of the slice corresponding to the transmit frequency. Accordingly, the thickness of the excited slice may be controlled by adjusting the bandwidth of the tuned transmitter circuit. Alternatively, the thickness of the excited slice may be controlled by adjusting the magnitude of the applied gradient.

In block 508, one or more of the nulling radiofrequency coils 210-220 are activated. As described above, the RF nulling radiofrequency coils 210-220 generate RF fields that disrupt the emitted NMR signals from the excited nuclei. In one embodiment, the RF nulling radiofrequency coils 210-220 may be configured to generate one or more null lines substantially parallel (or at least not perpendicular to) the magnetic field gradient (e.g., the magnetic field gradient in the x-axis, the magn . . . . , the magnetc . . . ). This ensures that each point of the RF null line belongs to a separately imaging plane of the subject.

As the nuclei of the subject transition from their excited state to a relaxed state, MR signals are generated from the excited nuclei. In block 510, the RF coil of the tuned receiving circuit samples the generated MR signals. Sampling the MR signals may be accomplished by generating a phase-encoding gradient and/or a frequency-encoding gradient to the excited nuclei. The gradients may be generated by the flux generating means, such as by using gradient coils perpendicular to those activated in step 504 to generate a slice-select gradient.

Conventionally, the MR signals are divided into voxels of the imaging plane. Typically, an imaging plane is made up of 65,536 voxels in a 256 by 256 square grid. By generating each of the phase-encode and frequency-encode gradients, the nuclei may be effectively identified as belonging to a respective voxel based on its phase and frequency characteristics.

In block 512, the MRI system processes the sampled MR signals. Processing of the MR signals may involve digital demodulation of the signals, and may include such subtasks as amplification of the sampled signals (sub-block 514), filtering the signal (sub-block 516), and analog-to-digital conversion of the signal (sub-block 518). The relative position of each sampled MR signal (i.e., the spatial origin of the signal within the subject) may be ascertained based on a combination of phase-encoding and frequency-encoding information. Thus, MR signals for each portion of the imaged plane of the subject may be sampled and processed by the tuned receiving circuit and downstream processing circuitry or techniques. The MR signal processing may be performed by one or more computers electrically coupled to the tuned receiver circuit, such as the computer described below in connection with FIG. 3. However, as discussed above, the NMR signals may be processed in an analog manner, such that the NMR signals correspond to a brightness value displayed on a raster screen. Analog processing of the NMR signals may avoid the need to perform an analog-to-digital conversion of such signals. The relative position of each sampled MR signal (i.e., the spatial origin of the signal within the subject) may be ascertained based on a combination of phase encoding and frequency encoding information. Thus, MR signals for each portion of the imaged plane of the subject may be sampled and processed by the tuned receiving circuit and downstream processing circuitry. The RF signal processed may performed by a computer electrically coupled to the tuned receiver circuit, such as the computer 400 described above in connection with FIG. 4.

The NMR signals are processed and represented as a voxel of the image. Once all the voxels are sampled and processed, an image for that plane may be generated The operation 500 of FIG. 5 may be repeated along various null lines of the subject. For instance, as described above, a typical plane a scanned subject may be made up of 65,536 voxels in a 256 by 256 square grid. Thus, the operation 500 of FIG. 5 may be performed separately for each null zone, thereby acquiring MR signals from multiple imaging planes at the same time (e.g., such as in a multi-slice process as shown and described with reference to FIGS. 3A-3C).

In this manner, the foregoing MRI apparatus 100 provides an improved image of an object undergoing an MRI procedure. The image may be substantially free of artifacts due to the selective application of the nulling radiofrequency coils 210-220. Thus, the operator of the MRI apparatus 100 can be assured that the resulting image is one that corresponds to the location of the nuclei within the null zone of the RF field emitted by the nulling radiofrequency coils 210-220.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A method of eliciting magnetic resonance signals from an object comprising:
   subjecting the object to a magnetic field;
   applying an excitation radiofrequency ("RF") signal to the object so as to tilt spin axes of nuclei within the object relative to the magnetic field;
   applying a spatially inhomogeneous RF variation signal to the object so that the variation signal affects spins within the object except in a zone within the object; and
   receiving RF signals emitted by the object after application of said excitation and variation signals so that the received RF signals include signals emitted by nuclei within said zone.

2. The method of claim 1 wherein said variation signal is effective to substantially randomize the orientations of nuclear spin axes except within said zone.

3. The method of claim 2 wherein said variation signal includes a random or pseudorandom noise component.

4. The method of claim 1 wherein:
   said variation signal is effective to shift the phase of rotation of nuclear spin axes except within said zone so that nuclei outside of said zone emit signals differing in phase from signals emitted by nuclei within zone; and
   said receiving step includes selecting signals by phase so as to exclude signals emitted by nuclei outside of said zone.

5. The method of claim 1 wherein:
   said variation signal is effective to shift the frequency of rotation of nuclear spin axes except within said zone so that nuclei outside of said zone emit signals differing in frequency from signals emitted by nuclei within said zone; and
   said receiving step includes selecting signals by frequency so as to exclude signals emitted by nuclei outside of said zone.

6. The method of claim 1 wherein said variation signal is inhomogeneous in at least two orthogonal directions.

7. The method of claim 6 wherein said variation signal is inhomogeneous only in first and second orthogonal directions so that said zone is an elongated line extending in a third direction orthogonal to said first and second directions.

8. The method of claim 7 wherein said step of applying a magnetic field is conducted so as to apply a magnetic field gradient in a third direction orthogonal to said first and second directions.

9. The method of claim 8 further comprising varying the spatial inhomogeneity of said variation signal so as to shift said zone in at least one of said first and second directions.

10. The method of claim 9 wherein said step of applying an excitation signal is performed so that said excitation signal consists essentially of frequencies corresponding to the Larmor frequencies of nuclei in a slice extending in said first and second directions and having a thickness in said third direction, whereby the received signals are signals from nuclei in a voxel at the intersection of said elongated zone and said slice.

11. An apparatus for eliciting magnetic resonance signals from an object comprising:
a magnet assembly configured to subject an object to a magnetic field;
a first pair of radiofrequency coils configured to apply an excitation radiofrequency ("RF") signal to the object so as to tilt spin axes of nuclei within the object relative to the magnetic field;
a second pair of radiofrequency coils configured to apply a spatially inhomogeneous RF variation signal to the object so that the variation signal affects spins within the object except in a zone within the object; and
a radiofrequency detector configured to detect RF signals emitted by the object after application of said excitation and variation signals so that the received RF signals include signals emitted by nuclei within said zone.

12. The apparatus of claim 11 wherein said variation signal is effective to substantially randomize the orientations of nuclear spin axes except within said zone.

13. The apparatus of claim 12 wherein said variation signal includes a random or pseudorandom noise component.

14. The apparatus of claim 11 wherein:
said variation signal is effective to shift the phase of rotation of nuclear spin axes except within said zone so that nuclei outside of said zone emit signals differing in phase from signals emitted by nuclei within zone; and
said radiofrequency detector is further configured to select signals by phase so as to exclude signals emitted by nuclei outside of said zone.

15. The apparatus of claim 11 wherein:
said variation signal is effective to shift the frequency of rotation of nuclear spin axes except within said zone so that nuclei outside of said zone emit signals differing in frequency from signals emitted by nuclei within said zone; and
said radiofrequency detector is further configured to detect signals by frequency so as to exclude signals emitted by nuclei outside of said zone.

16. The apparatus of claim 11 wherein said variation signal is inhomogeneous in at least two orthogonal directions.

17. The apparatus of claim 16 wherein said variation signal is inhomogeneous only in first and second orthogonal directions so that said zone is an elongated line extending in a third direction orthogonal to said first and second directions.

18. The apparatus of claim 17 wherein said magnet assembly is further configured to apply a magnetic field gradient in a third direction orthogonal to said first and second directions.

19. The apparatus of claim 18 wherein varying the spatial inhomogeneity of said variation signal is performed so as to shift said zone in at least one of said first and second directions.

20. The apparatus of claim 19 wherein the first radiofrequency coil is further configured to apply said excitation signal consisting essentially of frequencies corresponding to the Larmor frequencies of nuclei in a slice extending in said first and second directions and having a thickness in said third direction, whereby the detected signals are signals from nuclei in a voxel at the intersection of said elongated zone and said slice.

* * * * *